(12) United States Patent
Shoji (10) Patent No.: US 7,355,261 B2
(45) Date of Patent: Apr. 8, 2008

(54) THIN FILM DEVICE, THIN FILM DEVICE MODULE, AND METHOD OF FORMING THIN FILM DEVICE MODULE

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 98 days.

(21) Appl. No.: 11/491,150

(22) Filed: Jul. 24, 2006

(65) Prior Publication Data

US 2007/0023751 A1  Feb. 1, 2007

(30) Foreign Application Priority Data

Jul. 26, 2005  (JP) .............................. 2005-215884

(51) Int. Cl.
*H01L 23/58* (2006.01)
(52) U.S. Cl. ..................... 257/487; 257/30; 257/9; 257/424; 257/E29.014
(58) Field of Classification Search ................ 257/487, 257/E29.014
See application file for complete search history.

(56) References Cited

U.S. PATENT DOCUMENTS 5,183,592 A    2/1993  Ichimura et al.
6,147,738 A *  11/2000 Okamoto ..................... 349/122
6,340,831 B1 * 1/2002 Kuhara et al. ............... 257/461

FOREIGN PATENT DOCUMENTS

JP          2893782         3/1999

* cited by examiner

*Primary Examiner*—Tu-Tu Ho
(74) *Attorney, Agent, or Firm*—Oliff & Berridge, PLC (57) ABSTRACT

A thin film device includes a thin film element disposed on a surface of a substrate for high voltage formed of a material having an electric resistivity in the range of $10^8$ Ω·cm to $10^{10}$ Ω·cm, with an adhesive layer in between. The substrate for high voltage is a sintered body containing $Al_2O_3$, TiC, and MgO in a predetermined weight ratio. Therefore, if electric charges are generated in the thin film element, the electric charges are, while they are not accumulated in large amounts, gradually shifted via the adhesive layer to the substrate for high voltage, so that the generation of ESD can be suppressed. On the other hand, even when mounted on a lead frame, a sufficient dielectric breakdown voltage can be ensured. This provides a thin film device that is less susceptible to damage due to ESD, and has superior withstand voltage characteristic to permit a stable operation.

10 Claims, 8 Drawing Sheets

THIN FILM DEVICE, THIN FILM DEVICE MODULE, AND METHOD OF FORMING THIN FILM DEVICE MODULE

BACKGROUND OF THE INVENTION

1. Field of the Invention

The present invention relates to a thin film device having a thin film element functioning electrically or magnetically, and a thin film device module provided with a thin film device, as well as a method of forming a thin film device module.

2. Description of the Related Art

Figure 8:
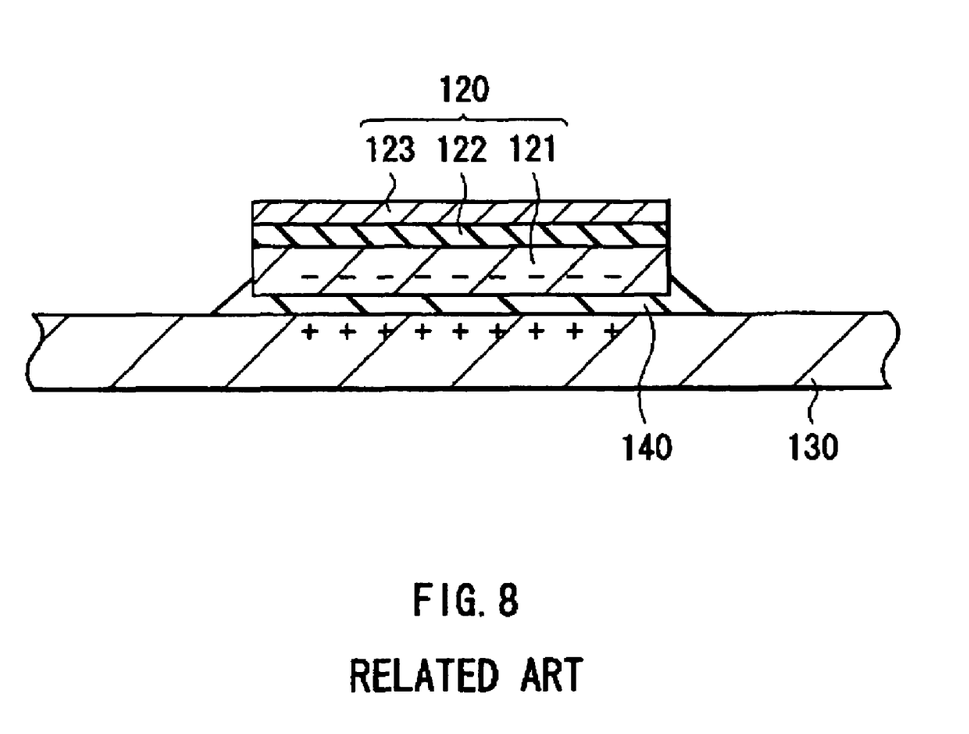
FIG. 8 is a sectional view showing the configuration of a thin film device module of the related art.

In general, a semiconductor device or a thin film device having a functional film such as a magnetic sensor is secured with adhesive to a conductive substrate such as a lead frame. For example, as shown in FIG. 8, a thin film device 120, which includes a functional film 123 disposed on a surface of a conductive substrate 121 of silicon (Si) or the like with an insulating film 122 in between, is fixed to a lead frame 130 with an adhesive layer 140 in between. Typically, however, the adhesive layer 140 is an insulator and therefore electric charge is apt to accumulate in the functional film 123, so that its surface potential may rise momentarily. Especially, as the thin film device 120 becomes smaller, it is more apt to be adversely affected. In some cases, the potential may rise up to about 10000 V, for example, with a slight amount of application of electric charge to the lead frame 130. In that case, due to a potential difference between the surface of the lead frame 130 and the surface of the functional film 123, electro-static discharge (hereinafter referred to as "ESD") will occur, causing damage or malfunction in the functional film 123.

As a method of connecting a lead frame and a thin film device, one is to use a conductive adhesive containing conductive filler instead of an insulating adhesive. The suppression of a rapid rise of the potential in the functional film may be expected by so doing. The conductive adhesive is one having an electric resistivity (a specific electric resistance) of about 1 to 10 $\Omega \cdot cm$, which is for example disclosed in Japanese Patent No. 2893782. With this method, it is possible to reduce the potential of the surface of the thin film device (the functional film) to the same level as the surface of the lead frame, and yet stabilize the potential.

SUMMARY OF THE INVENTION

Nevertheless, the above method using the conductive adhesive enables the suppression of ESD, whereas there is a limit of dielectric breakdown voltage between the lead frame and the thin film device, namely, up to about 1 kV. In the mounted state, however, a high voltage of 1 kV or above may be applied to the lead frame depending on its operating environment. Consequently, it should not be concluded that sufficient insulating property of the thin film device is ensured. Hence, there is a desire for further improvement in the dielectric breakdown voltage between the lead frame and the thin film device.

In view of the foregoing, it is desirable to provide a thin film device that is less susceptible to damage due to ESD, and has superior withstand voltage characteristic to permit a stable operation, as well as a thin film device module having a thin film device, and a method of forming a thin film device module.

A thin film device of an embodiment of the present invention includes: a substrate for high voltage formed of a material having an electric resistivity in the range of $10^8$ $\Omega \cdot cm$ to $10^{10}$ $\Omega \cdot cm$; and a thin film element disposed on a surface of the substrate for high voltage, with a conductive adhesive layer in between.

In the thin film device, the thin film element is disposed on a surface of the substrate for high voltage exhibiting an electric resistivity in the range of $10^8$ $\Omega \cdot cm$ to $10^{10}$ $\Omega \cdot cm$, with the conductive adhesive layer in between. Therefore, if electric charges are generated in the thin film element, these electric charges can be discharged gradually, instead of being accumulated in large amounts, via the conductive adhesive layer to the substrate for high voltage. This enables suppression of ESD, while ensuring a sufficient dielectric breakdown voltage.

A thin film device module of an embodiment of the present invention includes: a substrate for high voltage formed of a material having an electric resistivity in the range of $10^8$ $\Omega \cdot cm$ to $10^{10}$ $\Omega \cdot cm$; a thin film element disposed on a surface of the substrate for high voltage, with a first conductive adhesive layer in between; and a conductive substrate disposed on a surface of the substrate for high voltage opposite the thin film element, with a second conductive adhesive layer in between.

In the thin film device module, the thin film element is disposed on a surface of the substrate for high voltage exhibiting an electric resistivity in the range of $10^8$ $\Omega \cdot cm$ to $10^{10}$ $\Omega \cdot cm$, with the first conductive adhesive layer in between, and the conductive substrate is disposed on a surface of the opposite side of the substrate for high voltage, with the second conductive adhesive layer in between. Therefore, if electric charges are generated in the thin film element, these electric charges can be discharged gradually, instead of being accumulated in large amounts, via these conductive adhesive layers to the substrate for high voltage. This enables suppression of ESD, while ensuring sufficient dielectric breakdown voltage between the conductive substrate and the thin film element.

A method of forming a thin film device module of an embodiment of the present invention includes the step of: preparing a substrate for high voltage formed of a material having an electric resistivity in the range of $10^8$ $\Omega \cdot cm$ to $10^{10}$ $\Omega \cdot cm$; forming a thin film device by disposing a thin film element on the substrate for high voltage, with a first conductive adhesive layer in between; and disposing the thin film device on a conductive substrate, with a second conductive adhesive layer in between.

In the method of forming a thin film device, the thin film device is formed by disposing the thin film element on a surface of the substrate for high voltage exhibiting an electric resistivity in the range of $10^8$ $\Omega \cdot cm$ to $10^{10}$ $\Omega \cdot cm$, with the first conductive adhesive layer in between, and the thin film device is disposed on the conductive substrate, with the second conductive adhesive layer in between. Therefore, if electric charges are generated in the thin film element, the electric charges can be discharged gradually, instead of being accumulated in large amounts, via these conductive adhesive layers to the substrate for high voltage. This enables suppression of ESD, while ensuring a sufficient dielectric breakdown voltage between the conductive substrate and the thin film element.

In the thin film device, the thin film device module, and the method of forming a thin film device module an embodiment of the present invention, it is desirable to form the substrate for high voltage using a sintered body containing aluminum oxide ($Al_2O_3$), titanium carbide (TiC), and magnesium oxide (MgO). Preferably, the sintered body contains aluminum oxide ($Al_2O_3$) in the range of 30 weight % to 39 weight %, and titanium carbide (TiC) in the range of 21 weight % to 33 weight %.

In the thin film device of an embodiment of the present invention, the thin film element is disposed on a surface of the substrate for high voltage exhibiting an electric resistivity in the range of $10^8$ $\Omega\cdot$cm to $10^{10}$ $\Omega\cdot$cm, with the conductive adhesive layer in between. Therefore, if electric charges are generated in the thin film element, ESD can be suppressed by allowing these electric charges, while they are not accumulated in large amounts, to shift gradually via the conductive adhesive layer to the substrate for high voltage. On the other hand, even when disposed on the conductive substrate, it is possible to ensure a sufficient dielectric breakdown voltage. Hence, the thin film device is less susceptible to damage due to ESD, and has superior withstand voltage characteristic to permit a stable operation.

In the thin film device module of an embodiment of the present invention, the thin film element is disposed on a surface of the substrate for high voltage exhibiting an electric resistivity in the range of $10^8$ $\Omega\cdot$cm to $10^{10}$ $\Omega\cdot$cm, with the first conductive adhesive layer in between, and the conductive substrate is disposed on a surface of the opposite side of the substrate for high voltage, with the second conductive adhesive layer in between. Therefore, if electric charges are generated in the thin film element, ESD can be suppressed by allowing the electric charges, while they are not accumulated in large amounts, to shift gradually via these conductive adhesive layers to the substrate for high voltage. On the other hand, it is also possible to ensure a sufficient dielectric breakdown voltage between the conductive substrate and the thin film device. Hence, the thin film device module is less susceptible to damage due to ESD, and has superior withstand voltage characteristic to permit a stable operation.

In the method of forming a thin film device module of an embodiment of the present invention, after forming the thin film device by disposing the thin film element on the substrate for high voltage exhibiting an electric resistivity in the range of $10^8$ $\Omega\cdot$cm to $10^{10}$ $\Omega\cdot$cm, with the first conductive adhesive layer in between, the thin film device is disposed on a conductive substrate, with the second conductive adhesive layer in between. Therefore, if electric charges are generated in the thin film element, ESD can be suppressed by allowing the electric charges, while they are not accumulated in large amounts, to shift gradually via the conductive adhesive layer to the substrate for high voltage. Further, it is possible to ensure a sufficient dielectric breakdown voltage between the conductive substrate and the thin film device. Hence, it is easy to attain a thin film device module that is less susceptible to damage due to ESD, and has superior withstand voltage characteristic to permit a stable operation.

Other and further objects, features and advantages of the invention will appear more fully from the following description.

DESCRIPTION OF THE PREFERRED EMBODIMENTS

Preferred embodiments of the present invention will now be described in detail with reference to the accompanying drawings.

Figure 1:
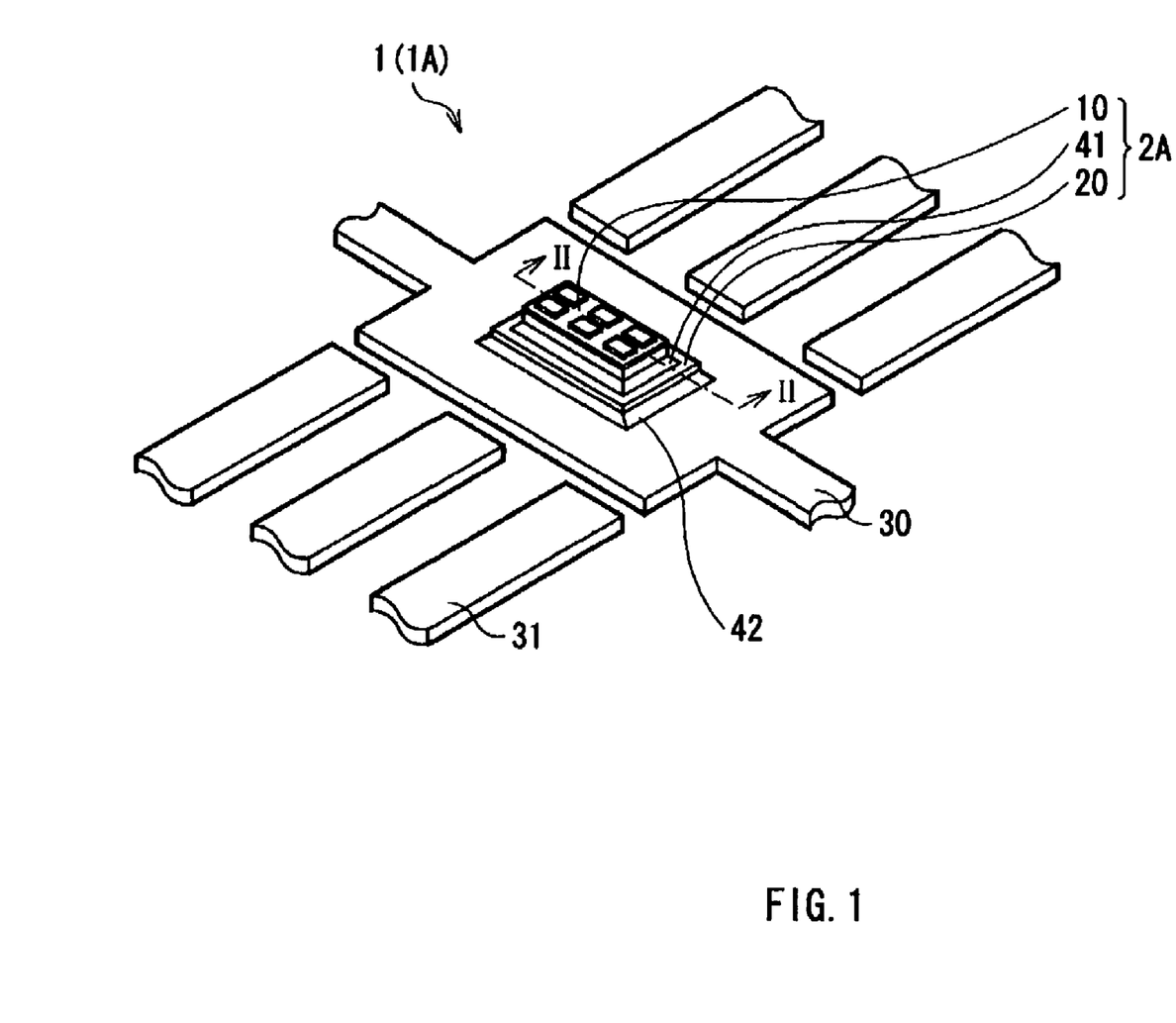
FIG. 1 is a perspective view showing the configuration of a module 1A as an embodiment of the present invention.
Figure 2:
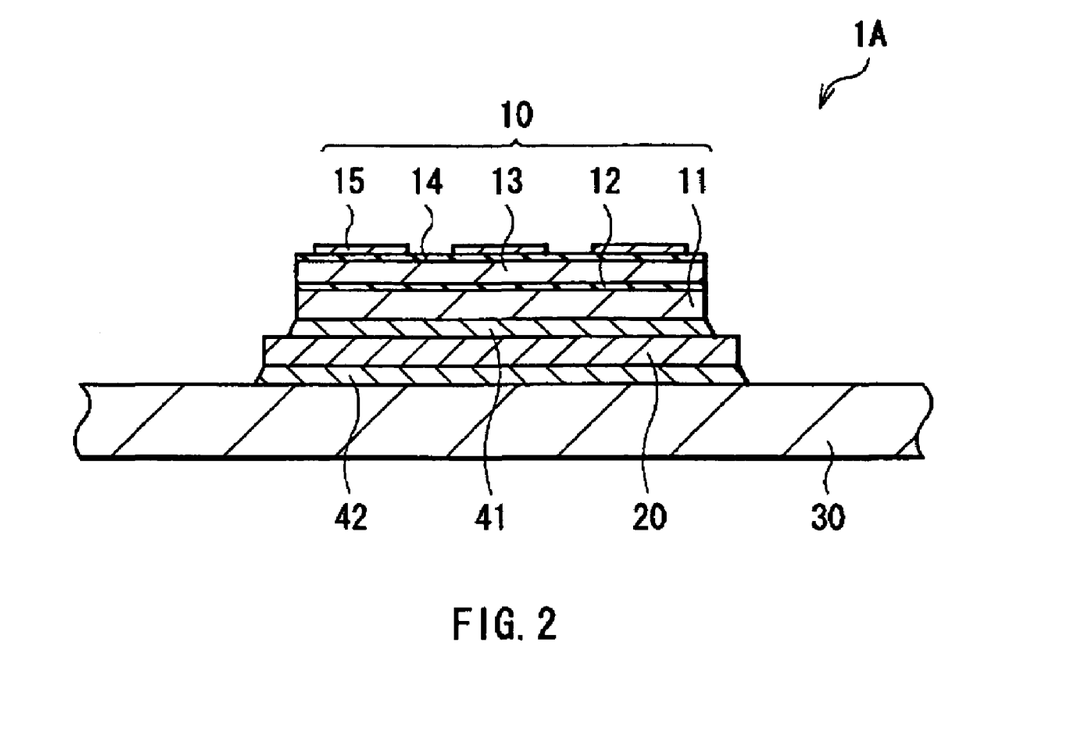
FIG. 2 is a sectional view showing in enlarged dimension a key part of the module 1A in FIG. 1.

Reference to FIGS. 1 and 2, description will first be made of the configuration of a thin film device module (hereinafter referred to simply as module) 1, as an embodiment of the present invention. In order to distinguish the module 1 of the embodiment from a thin film device module as a later-described modification, the module 1 is designated by a module 1A.

FIG. 1 shows a perspective configuration of the module 1A. FIG. 2 shows a laminating cross section in enlarged dimension a part of the module 1A of FIG. 1. The module 1A includes a thin film device 2A fixed on a flat lead frame 30 formed of a conductive material such as stainless steel with a conductive adhesive layer 42 (hereinafter referred to simply as an adhesive layer 42) in between. The thin film device 2A includes a thin film element 10 fixed on a substrate for high voltage 20 with a conductive adhesive layer 41 (hereinafter referred to simply as an adhesive layer 41) in between. Thus, this lamination includes the adhesive layer 42, the substrate for high voltage 20, the adhesive layer 41, and the thin film element 10, which are laminated in this order on the lead frame 30.

The thin film element 10 is, for example, a magnetic sensor, in which an insulating film 12, a giant magnetoresistive (GMR) film 13 providing a giant magnetoresistive effect, an insulating film 14, and a pad 15 are laminated in this order on a substrate 11. The substrate 11 is formed of a ceramics material having conductivity, such as silicon (Si) or aluminum-titanium-carbon (AlTic). The thickness of the GMR film 13 is, for example, in the range of 0.01 μm to 10 μm, and its width and length fall within, for example, the range of about 1 μm to about 500 μm. The thickness of the substrate 11 is, for example, in the range of 50 μm to 1000 μm, and its width and length fall within, for example, the range of about 0.5 mm to about 5 mm. The insulating films 12 and 14 are formed of aluminum oxide ($Al_2O_3$), and have a thickness of 0.25 μm, for example. The pad 15 is an electrode for supplying a sense current to read variations in the resistance of the GMR film 13 and is electrically connected to a lead 31 by wire or the like, as required.

The substrate for high voltage 20 is formed of a material exhibiting an electric resistivity in the range of $10^8$ $\Omega\cdot$cm to $10^{10}$ $\Omega\cdot$cm. The material that forms the substrate for high voltage 20 is a sintered body including aluminum oxide ($Al_2O_3$), titanium carbide (TiC), and magnesium oxide (MgO). More specifically, the sintered body contains $Al_2O_3$ in the range of 30 weight % (wt %) to 39 wt %, and TiC in the range of 21 wt % to 33 wt %.

When the $Al_2O_3$ content is below 30 wt %, the coefficient of thermal expansion as a sintered body is too large, possibly adversely affecting the function of the thin film element 10. On the other hand, when the $Al_2O_3$ content exceeds 30 wt %, workability will be degraded, which is therefore unsuitable. When the TiC content exceeds 33 wt %, sintering at the time of manufacturing becomes insufficient, failing to attain a sufficient dielectric breakdown and a desired electric resistivity required for the substrate for high voltage 20. On the other hand, when the TiC content is below 21 wt %, the mechanical strength as a sintered body becomes insufficient.

The dimensions of the substrate for high voltage 20 are in the range of 50 μm to 1000 μm in thickness, and in the range of about 0.5 mm to about 5 mm in width and length.

Since the module 1A employs the above-mentioned substrate for high voltage 20, if electric charges are generated in the thin film device 2A, they can be discharged gradually to the lead frame 30, instead of being accumulated in large amounts. As a result, the potential difference between the thin film element 10 and the lead frame 30 is slight, allowing for suppression of a momentary discharge phenomenon such as ESD. On the other hand, unlike a conductive adhesive containing a conductive filler which has an electric resistivity in the range of about 1 to $10^{10}$ Ω·cm, a sufficient dielectric breakdown voltage of a several kV or higher can be ensured. In addition, the module 1A is less susceptible to damages (the generation of cracks) and deformation due to temperature changes, and it has excellent mechanical strength, thereby increasing the reliability as a thin film device module.

The adhesive layers 41 and 42 are formed of a conductive adhesive, which is obtained by mixing filler such as silver (Ag) or silicon (Si) into epoxy resin.

The following is a method of forming the module 1A having the above-mentioned configuration.

In the method of forming the module 1A in the embodiment, firstly, the substrate for high voltage 20 is formed. Specifically, the required quantities of $Al_2O_3$ powder (for example, 0.5 μm in mean particle size, and 99.9% in purity), TiC powder (for example, 0.5 μm in mean particle size, 99.9% in purity, and 19% or higher in carbon content, 1% or below of which is free graphite), and MgO powder (for example, 0.1 μm in mean particle size) are weighed out, and these powders are ground and mixed with ethanol in a ball mill for about 30 minutes. This mixture is then subjected to spray granulation at 15° C. in nitrogen, thereby obtaining a granulated substance. Here, it is desirable to control the $Al_2O_3$ powder content to the range of 30 wt % to 39 wt %, and the TiC powder content to the range of 33 wt % to 21 wt %, with respect to a total weight of $Al_2O_3$ powder and TiC powder and MgO powder, and yet adjust the composition of the granulated substance. Subsequently, each granulated substance is subjected to primary forming under about 0.5 MPa (50 kgf/cm²), and then firing by using, for example, hot press method in an atmosphere of vacuum for one hour at a firing temperature of 1600° C. and at a press pressure of about 30 MPa (about 30 kgf/cm²), thereby obtaining the substrate for high voltage 20 having a predetermined thickness.

The substrate for high voltage 20 thus manufactured has a desired electric resistivity and less defect in crystalline structure, enabling to exhibit excellent functions in terms of withstand voltage characteristic, thermal conductivity, mechanical strength, and workability.

Next, the adhesive layer 41 is formed by applying a conductive adhesive onto the substrate for high voltage 20.

Thereafter, the thin film element 10 is mounted on and fixed to the adhesive layer 41, thereby forming the thin film device 2A.

Finally, the adhesive layer 42 is formed by applying a conductive adhesive onto the lead frame 30, and the thin film device 2A is mounted on and fixed to the adhesive layer 42. Thus, the formation of the module 1A is completed.

As above described, in the module 1A of the embodiment, the thin film element 10 is disposed on a surface of the substrate for high voltage 20 exhibiting an electric resistivity in the range of $10^8$ Ω·cm to $10^{10}$ Ω·cm with the conductive adhesive layer 41 in between, and the lead frame 30 is disposed on the opposite surface of the substrate for high voltage 20 with the conductive adhesive layer 42 in between. Therefore, before electric charges are accumulated in large amounts in the thin film element 10, the electric charges can be discharged gradually to the lead frame 30 via the substrate for high voltage 20 and the adhesive layer 42. This enables suppression of the generation of ESD. Moreover, since the substrate for high voltage 20 is the sintered body formed by mixing $Al_2O_3$, TiC, and MgO in a predetermined composition ratio, it is possible to ensure a sufficient dielectric breakdown voltage between the lead frame 30 and the GMR film 13. Hence, the thin film device module 1A is less susceptible to damage due to ESD, and has excellent withstand voltage characteristic to permit a stable operation and high reliability.

MODIFICATIONS

Modifications of the embodiment will be described below.

Although the foregoing embodiment includes the thin film element 10 as a magnetic sensor having the GMR film 13, the present invention is not limited to including the thin film element 10. For example, like a module 1B as a first modification (Modification 1) as shown in FIG. 3, a thin film device 2B may include a thin film element 50 that contains an integrated circuit (IC) 51 having a semiconductor device and the like.

Figure 3:
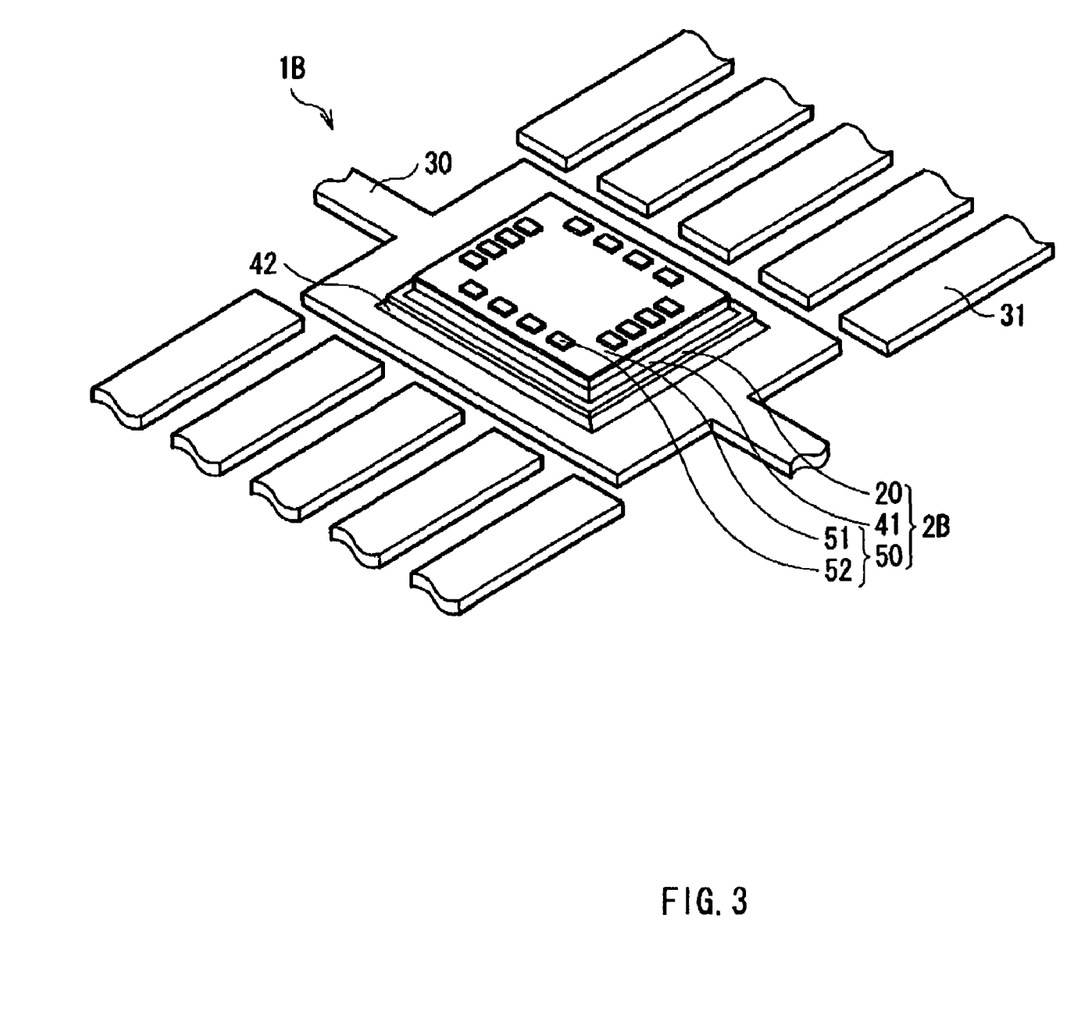
FIG. 3 is a perspective view showing the configuration of a module 1B as a first modification in an embodiment of the present invention.
Figure 4:
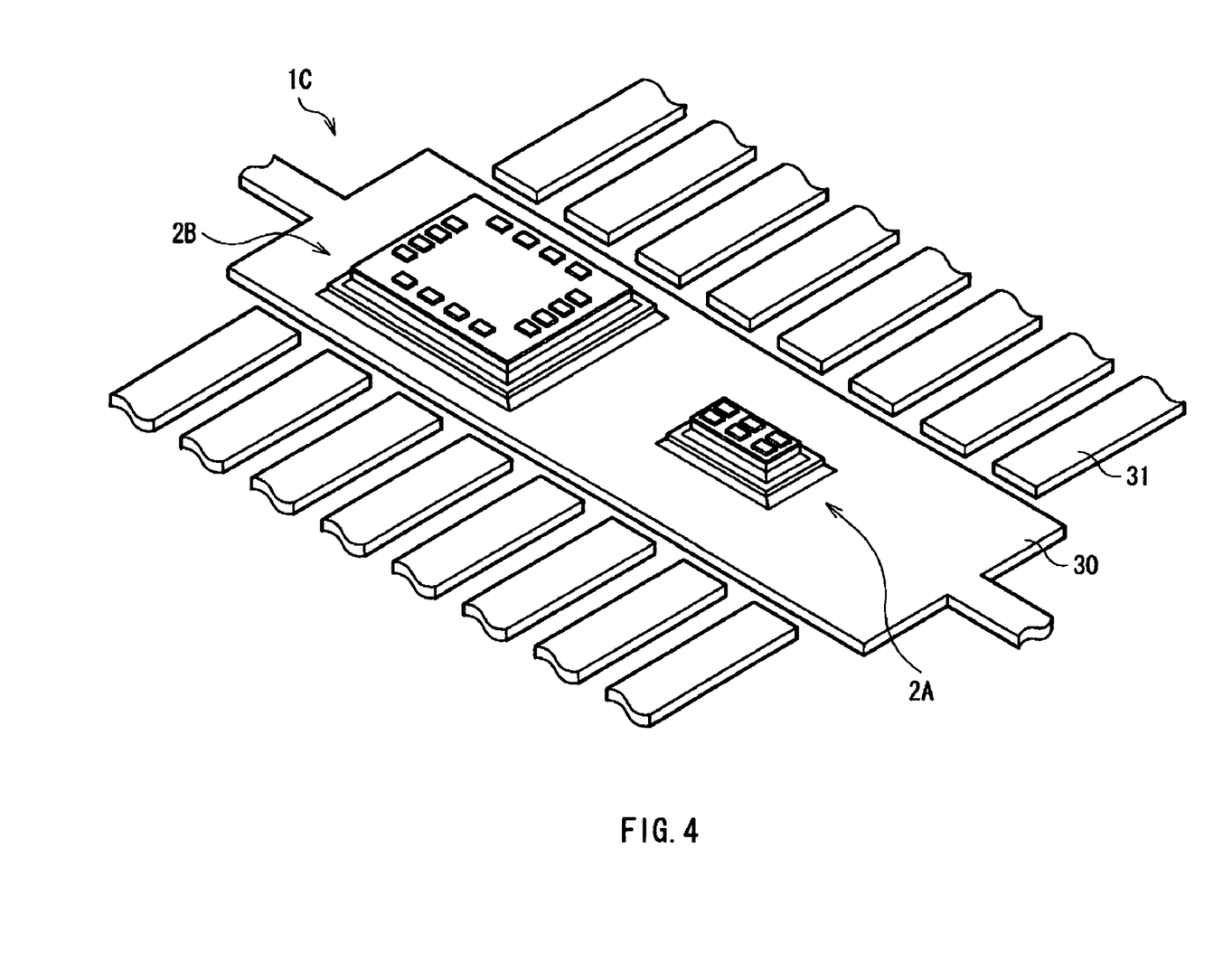
FIG. 4 is a perspective view showing the configuration of a module 1C as a second modification in an embodiment of the present invention.

Alternatively, like a module 1C as a second modification (Modification 2) as shown in FIG. 4, the thin film device 2A as shown in FIG. 1, and the thin film device 2B as shown in FIG. 3 may be provided on one lead frame 30.

These modifications 1 and 2 also produce the same effects as the module 1A of the embodiment.

EXAMPLES

The following is examples of the present invention.

In the examples, samples corresponding to the module 1A as shown in FIGS. 1 and 2 were prepared, and their respective dielectric breakdown voltages were measured.

Figure 5:
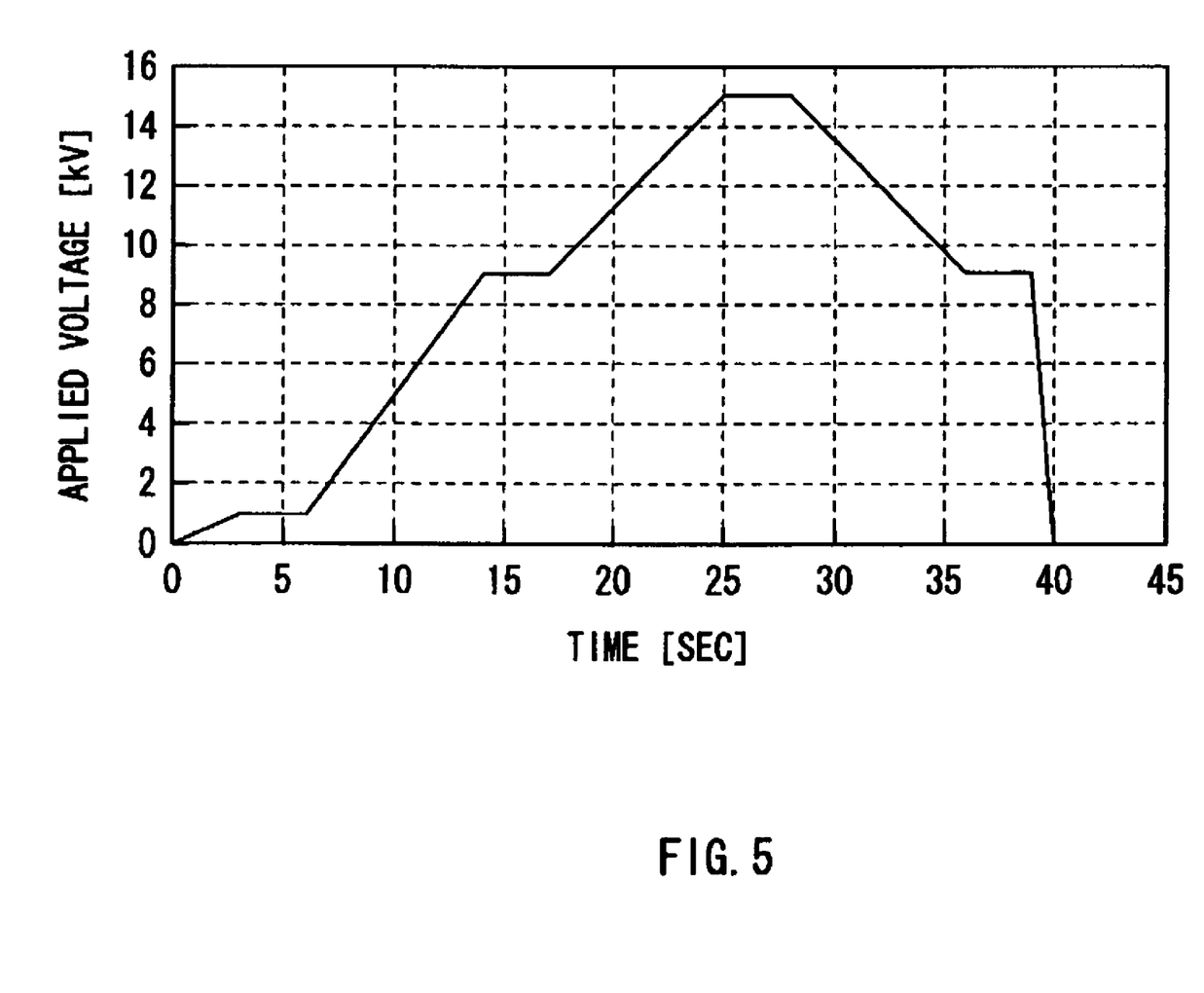
FIG. 5 is a characteristic diagram showing conditions under which dielectric breakdown voltage is measured in an example of the present invention.

That is, the measurements were made with the sample immersed in an oil bath, while changing an applied voltage (kV) with the passage of time (second) in accordance with the profile as shown in FIG. 5. The maximum applied voltage was 15 kV.

Figure 6:
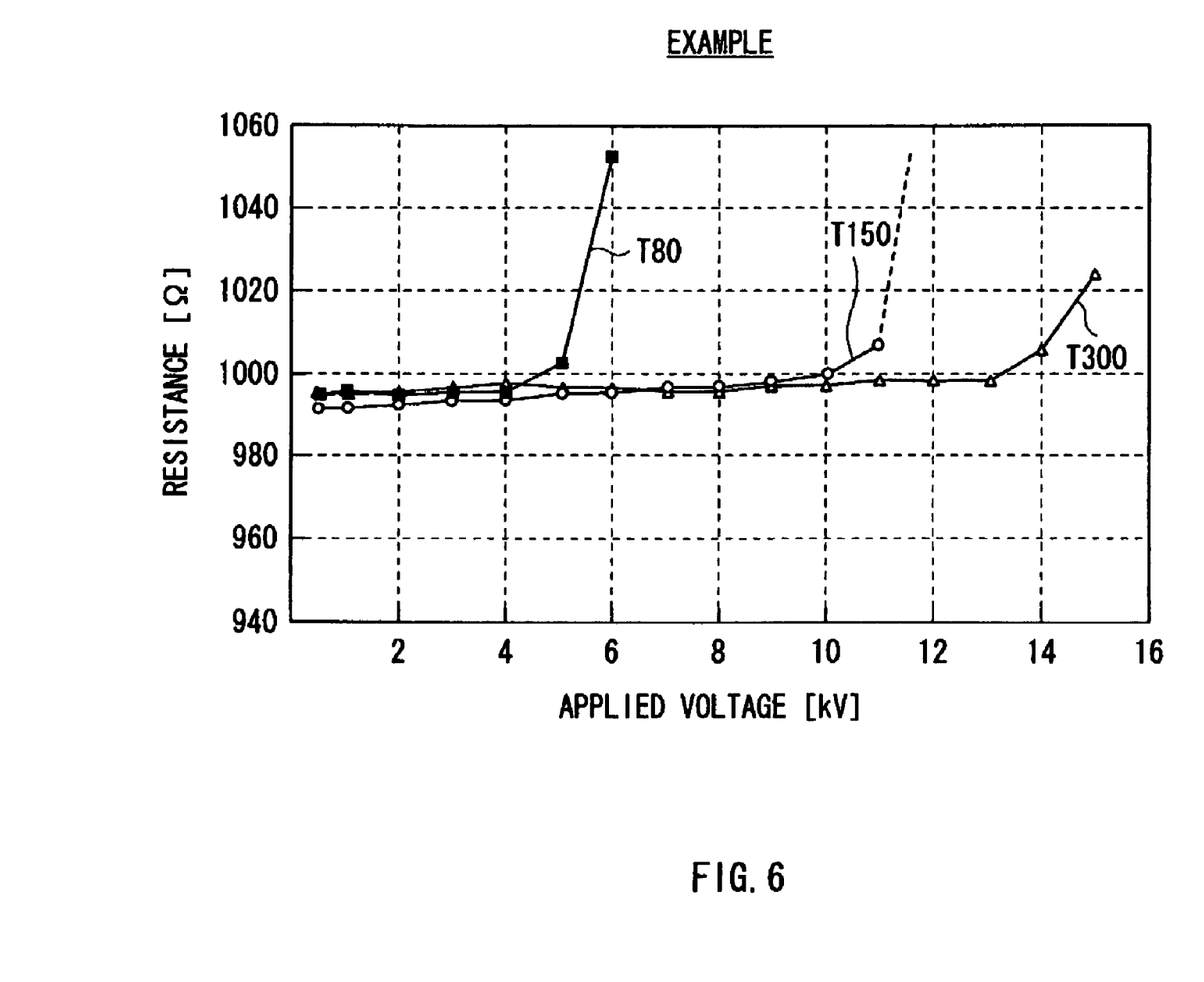
FIG. 6 is a characteristic diagram showing withstand voltage characteristic in an example of the present invention.

FIG. 6 shows the results of the measurements of the dielectric breakdown voltages of the substrate for high voltage 20. In FIG. 6, the abscissa represents an applied voltage, and the ordinate represents the resistance of the module as a whole. In these examples, the thickness of the substrate for high voltage 20 had three levels of 80 μm, 150 μm, and 300 μm, which were designated by T80, T150, and T300, respectively. As a result, the dielectric breakdown voltage was 5 kV when the thickness was 80 μm, 11 kV when it was 150 μm, and 14 kV when it was 300 μm.

Figure 7:
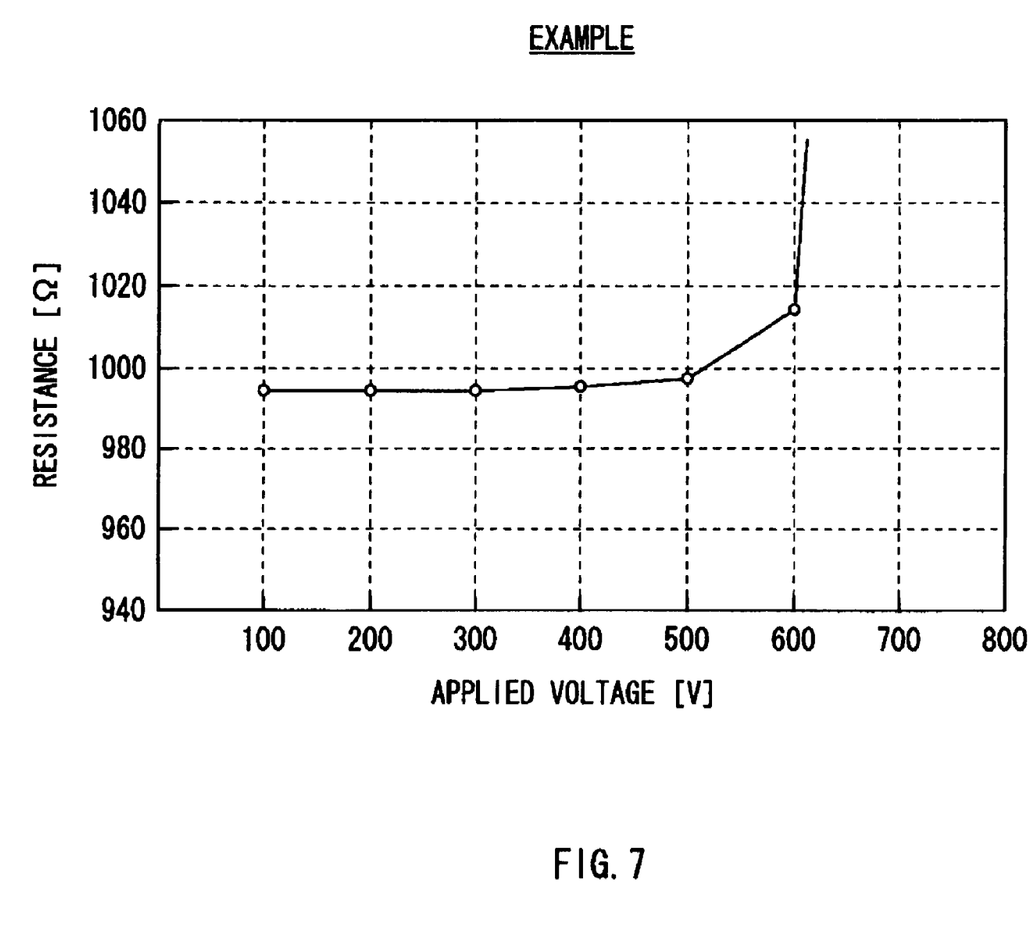
FIG. 7 is another characteristic diagram showing withstand voltage characteristic in an example of the present invention.

Further, an ESD breakdown test was carried out on the sample corresponding to the module 1A shown in FIGS. 1 and 2. FIG. 7 shows the results of the measurements of the dielectric breakdown voltages of the insulating film 12 that was formed of $Al_2O_3$ and had a thickness of 0.25 µm. In FIG. 7, the abscissa represents an applied voltage as in FIG. 6, and the ordinate represents the resistance between the substrate 11 and the GMR film 13. As apparent from FIG. 7, the insulating film 12 caused dielectric breakdown in the range of about 500 to 600 V. However, the maximum potential difference between the Si substrate 11 and the GMR film 13 was about 50 V. Consequently, there was neither the danger of dielectric breakdown of the insulating film 12, nor ESD breakdown of the GMR film 13.

Thus, it was confirmed that this example had a sufficiently large dielectric breakdown voltage, namely 5 kV or higher, and had a sufficient resistance to ESD breakdown. That is, it was proved that this example was capable of maintaining superior functions as a thin film device.

It is to be understood that the present invention should not be limited to the foregoing embodiment but is susceptible of various changes and modifications based on the concept of the present invention, which may be considered as coming within the scope of the present invention as claimed in the appended claims. Although in the foregoing embodiment, the substrate for high voltage is formed of $Al_2O_3$, TiC, and MgO, other kind of material may be added. For example, mechanical strength can be further improved by adding a predetermined amount of titanium dioxide ($TiO_2$). The thin film element may include any functional element other than a magnetoresistive element and a semiconductor device. Although the conductive adhesive is used to form the adhesive layer, a metallic wax material may be melted and adhered so as to form a conductive adhesive layer.

What is claimed is:

1. A thin film device comprising:
    a substrate for high voltage formed of a material having an electric resistivity in the range of $10^8$ Ω·cm to $10^{10}$ Ω·cm; and
    a thin film element disposed on a surface of the substrate for high voltage, with a conductive adhesive layer in between.

2. The thin film device according to claim 1 wherein,
    the substrate for high voltage is a sintered body containing aluminum oxide ($Al_2O_3$), titanium carbide (TiC), and magnesium oxide (MgO).

3. The thin film device according to claim 2 wherein,
    the sintered body contains aluminum oxide ($Al_2O_3$) in the range of 30 weight % to 39 weight %, and titanium carbide (TiC) in the range of 21 weight % to 33 weight %, with respect to a total weight.

4. The thin film device according to claim 1 wherein,
    the thin film element includes a configuration in which an insulating film and a magnetoresistive element are laminated in this order on a substrate.

5. A thin film device module comprising:
    a substrate for high voltage formed of a material having an electric resistivity in the range of $10^8$ Ω·cm to $10^{10}$ Ω·cm;
    a thin film element disposed on a surface of the substrate for high voltage, with a first conductive adhesive layer in between; and
    a conductive substrate disposed on a surface of the substrate for high voltage opposite the thin film element, with a second conductive adhesive layer in between.

6. The thin film device module according to claim 5 wherein,
    the substrate for high voltage is a sintered body containing aluminum oxide ($Al_2O_3$), titanium carbide (TiC), and magnesium oxide (MgO).

7. The thin film device module according to claim 6 wherein,
    the sintered body contains aluminum oxide ($Al_2O_3$) in the range of 30 weight % to 39 weight %, and titanium carbide (TiC) in the range of 21 weight % to 33 weight %, with respect to a total weight.

8. A method of forming a thin film device module comprising the steps of:
    preparing a substrate for high voltage formed of a material having an electric resistivity in the range of $10^8$ Ω·cm to $10^{10}$ Ω·cm;
    forming a thin film device by disposing a thin film element on the substrate for high voltage, with a first conductive adhesive layer in between; and
    disposing the thin film device on a conductive substrate, with a second conductive adhesive layer in between.

9. The method of forming a thin film device module according to claim 8 wherein,
    the substrate for high voltage is a sintered body containing aluminum oxide ($Al_2O_3$), titanium carbide (TiC), and magnesium oxide (MgO).

10. The method of forming a thin film device module according to claim 9 wherein,
    the sintered body contains aluminum oxide ($Al_2O_3$) in the range of 30 weight % to 39 weight %, and titanium carbide (TiC) in the range of 21 weight % to 33 weight %, with respect to a total weight.

* * * * *